United States Patent [19]

Naarmann et al.

[11] 4,411,826

[45] Oct. 25, 1983

[54] PREPARATION OF STABLE ELECTRICALLY CONDUCTIVE POLYMERS

[75] Inventors: Herbert Naarmann, Wattenheim; Klaus Penzien, Frankenthal; Johannes Schlag; Petr Simak, both of Ludwigshafen, all of Fed. Rep. of Germany

[73] Assignee: BASF Aktiengesellschaft, Fed. Rep. of Germany

[21] Appl. No.: 344,013

[22] Filed: Jan. 29, 1982

[30] Foreign Application Priority Data

Feb. 18, 1981 [DE] Fed. Rep. of Germany ....... 3105948

[51] Int. Cl.$^3$ ............................................. H01B 1/06
[52] U.S. Cl. .................................... 252/518; 526/285; 528/481
[58] Field of Search ................ 252/500, 518; 526/285; 528/481

[56] References Cited

U.S. PATENT DOCUMENTS 4,222,903  9/1980  Heeger et al. ...................... 252/518

FOREIGN PATENT DOCUMENTS 2219350  12/1974  Fed. Rep. of Germany .

OTHER PUBLICATIONS

"Chemical Abstracts", vol. 70, No. 2, 1969, pp. 474, 475, No. 4875g.
Synthetic Metals 1 (1979), pp. 21–28, 101–118.

Primary Examiner—Josephine Barr
Attorney, Agent, or Firm—Keil & Witherspoon

[57] ABSTRACT

Stable electrically conductive polymers having conductivities greater than $10^{-2}$ S/cm are prepared by heating p-doped polyacetylenes, in the absence of oxygen and moisture, for from 0.1 to 3 hours, preferably from 0.5 to 1.0 hour, at from 500° to 1,100° C., preferably from 550° to 850° C. The electrically conductive polymers obtained can be used in the electrical industry for the production of solar cells, for the utilization and fixing of radiation, for the production of electrical and magnetic switches and stores, and for the antistatic treatment of plastics.

3 Claims, No Drawings

PREPARATION OF STABLE ELECTRICALLY CONDUCTIVE POLYMERS

The invention relates to a process for the preparation of stable electrically p-conductive polymers, having conductivities greater than $10^{-2}$ S/cm, by doping polyacetylenes with from 15 to 66 percent by weight, based on polyacetylene, of an electron acceptor dopant.

The preparation of electrically conductive polymers by doping polyacetylene with an electron acceptor, especially with a Lewis acid, has been disclosed (cf., for example, U.S. Pat. No. 4,222,903 and Synthetic Metals 1 (1979/80), 101–118).

These conventional systems are distinguished by good electrical conductivity; they constitute p-type conductors. However, they are very sensitive to oxygen and moisture, and accordingly, within a short time, the electrical conductivity drops drastically as a result of oxidation or of decomposition of the dopant by water (ie. moisture). Accordingly, such materials cannot be employed industrially.

It is an object of the present invention to provide electrically conductive polymers, based on polyacetylene, which in addition to having a high electrical conductivity also possess satisfactory stability to atmospheric oxygen and moisture and, by virtue of this combination of properties, having interesting uses.

We have found that this object is achieved, according to the invention, by heating p-doped polyacetylenes, in the absence of oxygen and moisture, for from 0.1 to 3 hours, preferably from 0.5 to 1.0 hour, at from 500° to 1,100° C., preferably from about 550° to 850° C.

For the purposes of the present invention, stable electrically conductive polymers having conductivities greater than $10^{-2}$ S/cm are materials which are stable to atmospheric oxygen and moisture at room temperature and exhibit no decrease in electrical conductivity. The electrical conductivities of the polymers are measured by the method of F. Beck, Ber. Bunsenges., Phys. Chem. 68 (1964), 558–567, at 30° C., and are expressed in S/cm.

For the purposes of the present invention, polyacetylenes include polyacetylene itself, ie. $(CH)_x$, as well as acetylene copolymers and substituted polyacetylenes. Suitable comonomers which can be copolymerized with acetylene are, in particular, dialkynes and/or polyalkynes, eg. butadiyne, hexadiyne, octadiyne and others (cf., for example, German Laid-Open Application DOS No. 2,912,572). In the substituted polyacetylenes, some or all of the hydrogen atoms on the polymer chain are replaced by halogen, especially Cl, Br or I, by alkyl, especially of 1 to 8 carbon atoms, by a phenyl radical, eg. phenyl, halophenyl or alkylphenyl, or by more than one of these groups. The polyacetylenes, which can be prepared by polymerizing the monomers with Ziegler-Natta catalysts, or by means of reducing agents and heavy metal salts, for example by the process described in U.S. Pat. No. 3,092,613, can be employed in any desired form, for example as films, sheets, pressed sheets or powders.

Polyacetylenes doped with electron acceptors to give p-conductors are described in Synthetic Metals 1 (1979/80), 101–118. The preparation of p-doped polyacetylenes is also disclosed in U.S. Pat. No. 4,222,903. Using conventional methods, the polyacetylenes are doped by treatment with 15–66, preferably 20–50, percent by weight, based on polyacetylene, of an electron acceptor, thereby substantially increasing the conductivity of the particular polymer system (p-type conductor). Suitable electron acceptors for p-doping the polyacetylenes are, in particular, Lewis acids, eg. $H_2SO_4$, $AsF_5$, $SbF_5$, $UF_6$, $SbCl_5$, $AlCl_3$, $BF_3$, $CF_3SO_3H$, $VOCl_3$, $HClO_4$, $NO^+SbF_6^-$, $NO_2^+SbF_6^-$, $NO^+AsF_6^-$, $NO^+PF_6^-$, $I_2$, $Br_2$, $ICl$, $PF_5$, $CrO_2Cl_2$, $NO_2^+PF_6^-$, $NO^+BF_4^-$, $NO^+ClO_4^-$, $(CF_3)_2SO_4$, $NbF_5$, $TaF_5$, $WF_6$, $FeCl_3$, $AlBr_3$, $CdCl_2$, 2,4,6-trinitrophenol, 2,4,6-trinitrophenylsulfonic acid and 2,4,6-trinitrobenzoic acid.

In the process according to the invention, the p-doped polyacetylenes, prepared in a conventional manner from polyacetylenes and electron acceptor dopants, for example in accordance with the above publications, are heated, in the absence of oxygen and moisture (water), for from 0.1 to 3 hours, preferably from 0.5 to 1.0 hour, at from 500° to 1,100° C., preferably from about 550° to 850° C. Advantageously, the process is carried out under an inert gas atmosphere, for example a noble gas atmosphere such as argon, and heating is effected in the absence of a solvent.

The process according to the invention gives electrically conductive polyacetylenes which have electrical conductivities greater than $10^{-2}$ S/cm and improved stability to oxygen and moisture, and which are useful for the antistatic treatment of plastics, the production of solar cells, the conversion and fixing of radiation and the production of electrical and magnetic switches and stores.

In the Examples which follow, parts are by weight.

EXAMPLES 1 to 9

Various p-doped polyacetylenes, prepared in accordance with Example 1 of U.S. Pat. No. 4,222,903, are heated under an argon atmosphere, in the absence of moisture, to the temperatures shown below, kept at these temperatures for 1 hour and then cooled again. The electrical conductivities (measured by the method of F. Beck, Ber. Bunsengesl., Phys. Chem. 68 (1964), 558–567) of the polymers obtained persist even when the samples are stored in air for several days.

| Example No. | Polymer type 100 parts | Dopant Amount [parts] | Dopant Type | Temperature to which heated [°C.] | Conductivity [S/cm] |
|---|---|---|---|---|---|
| 1 | + | 35 | $I_2$ | 650 | $1.5 \times 10$ |
| 2 | + | 56 | $I_2$ | 650 | $2.3 \times 10$ |
| 3 | + | 64 | $I_2$ | 650 | 4.8 |
| 4 | + | 28 | $AsF_5$ | 650 | $7.3 \times 10$ |
| 5 | ++ | 36 | $SbF_5$ | 720 | $2.3 \times 10$ |
| 6 | ++ | 48 | $NO^+SbF_6^-$ | 750 | $1.0 \times 10^2$ |
| 7 | ++ | 35 | $HClO_4$ | 820 (decomp.) | $3.9 \times 10$ |
| 8 | ++ | 53 | $H_2SO_4$ | 760 | 4.2 |
| 9 | ++ | 49 | $AlBr_3$ | 750 | $3.9 \times 10$ |

+ = Synthesized by the method of Shirakawa, J. Chem. Soc., Chem. Comm. (1977), 578–580.
++ = Synthesized by the method of Luttinger, U.S. Pat. No. 3,092,613.

We claim:
1. A process for the preparation of electrically conductive polymers of improved stability with conductivities greater than $10^{-2}$ S/cm which comprises:
doping a polyacetylene with from 15 to 66% by weight, based on the polyacetylene, of an electron acceptor dopant to give p-type conductors having conductivities greater than $10^{-2}$ S/cm, wherein the improvement comprises heating the p-doped polyacetylene in the absence of oxygen and moisture for from 0.1 to 3 hours at from 500° to 1,100° C.

2. The process of claim 1, wherein heating is effected for from 0.5 to 1.0 hour.

3. The process of claim 1, wherein heating is effected at from 550° to 850° C.